US012795964B2

(12) United States Patent
Ko et al.

(10) Patent No.: US 12,795,964 B2
(45) Date of Patent: Nov. 10, 2026

(54) ELECTROSTATIC DISCHARGE DEVICE AND DISPLAY DRIVE CHIP INCLUDING THE SAME

(71) Applicant: Samsung Electronics Co., Ltd., Suwon-si (KR)

(72) Inventors: Jaehyok Ko, Suwon-si (KR); Changsig Kang, Suwon-si (KR); Junhyeok Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 361 days.

(21) Appl. No.: 18/458,614

(22) Filed: Aug. 30, 2023

(65) Prior Publication Data

US 2024/0105856 A1 Mar. 28, 2024

(30) Foreign Application Priority Data

Sep. 23, 2022 (KR) ........................ 10-2022-0121133

(51) Int. Cl.

*H10D 8/00* (2025.01)
*H10D 62/10* (2025.01)

(Continued)

(52) U.S. Cl.

CPC ............. *H10D 8/00* (2025.01); *H10D 62/126* (2025.01); *H10D 64/23* (2025.01); *H10D 89/611* (2025.01); *H10D 89/931* (2025.01)

(58) Field of Classification Search

CPC ........ H10D 8/00; H10D 62/126; H10D 64/23; H10D 89/611; H10D 89/713;

(Continued)

(56) References Cited

U.S. PATENT DOCUMENTS

| | | | |
|---|---|---|---|
| 8,174,806 | B2 | 5/2012 | Kim et al. |
| 8,735,979 | B2 | 5/2014 | Deval et al. |

(Continued)

FOREIGN PATENT DOCUMENTS

| | | | |
|---|---|---|---|
| KR | 2012/0068185 | A | 6/2012 |
| KR | 2019/0098322 | A | 8/2019 |

(Continued)

OTHER PUBLICATIONS

Korean Office Action dated Apr. 14, 2026 for corresponding Korean Patent Application No. 10-2022-121133 and its English-language translation.

*Primary Examiner* — Shahed Ahmed

(74) *Attorney, Agent, or Firm* — Harness, Dickey & Pierce, P.L.C.

(57) ABSTRACT

An electrostatic discharge (ESD) device may include a semiconductor substrate, a base well in the semiconductor substrate, a first region including a first impurity region having a first conductivity type within the base well, a second region apart from the first region in a horizontal direction in the base well and including a second impurity region having a second conductivity type a first silicide layer at least partially overlapping the first impurity region in a vertical direction on the first impurity region, and a second silicide layer on the second impurity region and apart from the first silicide layer in the horizontal direction. The second silicide layer may at least partially overlap the second impurity region in the vertical direction. The second conductivity type may be opposite the first conductivity type.

20 Claims, 11 Drawing Sheets

(51) Int. Cl.
*H10D 64/23* (2025.01)
*H10D 89/60* (2025.01)

(58) Field of Classification Search
CPC .......... H10D 89/60–931; H10D 84/013–0133; H10D 30/0212–0213; G09G 3/20; G09G 2330/06; H01L 23/60
See application file for complete search history.

(56) References Cited

U.S. PATENT DOCUMENTS

| | | | | |
|---|---|---|---|---|
| 10,340,266 | B2 | 7/2019 | Solaro et al. | |
| 10,453,836 | B2 | 10/2019 | Solaro et al. | |
| 2009/0108346 | A1 * | 4/2009 | Cai | H10D 30/65 438/236 |
| 2014/0210003 | A1 * | 7/2014 | Ko | H10D 84/401 438/237 |
| 2021/0193643 | A1 * | 6/2021 | Hsu | H10D 30/0212 |

FOREIGN PATENT DOCUMENTS

| | | | |
|---|---|---|---|
| KR | 102142156 | B1 | 8/2020 |
| KR | 102383641 | B1 | 4/2022 |
| KR | 2023/0036029 | A | 3/2023 |

* cited by examiner

ELECTROSTATIC DISCHARGE DEVICE AND DISPLAY DRIVE CHIP INCLUDING THE SAME

CROSS-REFERENCE TO RELATED APPLICATION

This application is based on and claims priority under 35 U.S.C. § 119 to Korean Patent Application No. 10-2022-0121133, filed on Sep. 23, 2022 in the Korean Intellectual Property Office, the disclosure of which is incorporated by reference herein in its entirety.

BACKGROUND

Inventive concepts relate to an electrostatic discharge (ESD) device, and more particularly, to an ESD device having a diode structure and/or a display drive chip including the same.

Semiconductor devices may be momentarily exposed to ESD of several thousand volts or more due to various causes. When a semiconductor device is exposed to ESD, the semiconductor device may be destroyed or damaged due to destruction of a gate insulating layer of a transistor in the semiconductor device or junction spiking at a metal-silicon junction. Therefore, ESD may seriously affect the reliability of semiconductor devices. In order to limit and/or prevent damage caused by ESD, ESD devices or ESD protection circuits have been generally used in electronic devices. Recently, as electronic devices have become highly integrated, chip size has continued to decrease. Accordingly, research has continued to reduce the size of ESD devices or ESD protection circuits, while maintaining ESD resistance.

SUMMARY

Inventive concepts provide an electrostatic discharge (ESD) device having a small size and/or improved reliability, and/or a display drive chip including the device.

According to an embodiment of inventive concepts, an electrostatic discharge (ESD) device may include a semiconductor substrate, a first silicide layer, and a second silicide layer. The semiconductor substrate may include a base well, a first region in the base well, and a second region in the base well. The first region may include a first region base well having a first conductivity type and a first impurity region having the first conductivity type on the first region base well. The second region may be apart from the first region in a horizontal direction in the base well. The second region may include a second region base well having a second conductivity type, a second region intermediate well having the second conductivity type in the second region base well, and a second impurity region having the second conductivity type on the second region intermediate well. The second conductivity type may be opposite the first conductivity type. The first silicide layer may be on the first impurity region. The first silicide layer at least partially may overlap the first impurity region in a vertical direction. The second silicide layer may be on the second impurity region and may be spaced apart from the first silicide layer in the horizontal direction. The second silicide layer at least partially may overlap the second impurity region in the vertical direction. A first portion of the base well may be located between the first region and the second region. At least a portion of the first portion of the base well may be located in a first separation region of the semiconductor substrate between the first silicide layer and the second silicide layer.

According to an embodiment of inventive concepts, an electrostatic discharge (ESD) device may include a semiconductor substrate, a first silicide layer, a second silicide layer, and a dummy gate structure. The semiconductor substrate may include a base well, a first region in the base well, and a second region in the base well. The base well may have a first conductivity type. The first region may include a first region base well having the first conductivity type and a first impurity region on the first region base well. The first impurity region may have the first conductivity type. The second region may be apart from the first region in a horizontal direction. The second region may include a second region base well having a second conductivity type, a second region intermediate well having the second conductivity type in the second region base well, and a second impurity region having the second conductivity type on the second region intermediate well. The second conductivity type may be opposite the first conductivity type. The first silicide layer may be on the first impurity region. The first silicide layer at least partially may overlap the first impurity region in a vertical direction. The second silicide layer may be on the second impurity region. The second silicide layer may be apart from the first silicide layer in the horizontal direction. The second silicide layer at least partially may overlap the second impurity region in the vertical direction. The dummy gate structure may be on an upper surface of the semiconductor substrate. The dummy gate structure may be on a first separation region of the semiconductor substrate. The first separation region may be between the first silicide layer and the second silicide layer. The first silicide layer may be connected to a first electrode. The second silicide layer may be connected to a second electrode.

According to an embodiment of inventive concepts, a display drive chip may include a circuit region, an input region, and an output region. The output region may include a plurality of cells. The plurality of cells may include an electrostatic discharge (ESD) device. The ESD device may include a P-type semiconductor substrate, a base well having N-type in the P-type semiconductor substrate, a first region in the base well, a second region in the base well, a first silicide layer, and a second silicide layer. The first region may include a first region base well having a first conductivity type and a first impurity region having the first conductivity type on the first region base well. The second region may be apart from the first region in a horizontal direction in the base well. The second region may include a second region base well having a second conductivity type, a second region intermediate well having the second conductivity type in the second region base well, and a second impurity region having the second conductivity on the second region intermediate well. The second conductivity type may be opposite the first conductivity type. The first silicide layer may be on the first impurity region. The first silicide layer at least partially may overlap the first impurity region in a vertical direction. The second silicide layer may be on the second impurity region and may be spaced apart from the first silicide layer in the horizontal direction. The second silicide layer at least partially may overlap the second impurity region in the vertical direction. A portion of the base well may be between the first region and the second region. The portion of the base well may be exposed to an upper surface of the P-type semiconductor substrate between the first silicide layer and the second silicide layer. The first silicide layer may be connected to a first electrode. The second silicide layer may be connected to a second electrode.

BRIEF DESCRIPTION OF THE DRAWINGS

Embodiments may be more clearly understood from the following detailed description taken in conjunction with the accompanying drawings in which.

DETAILED DESCRIPTION

Figure 1:
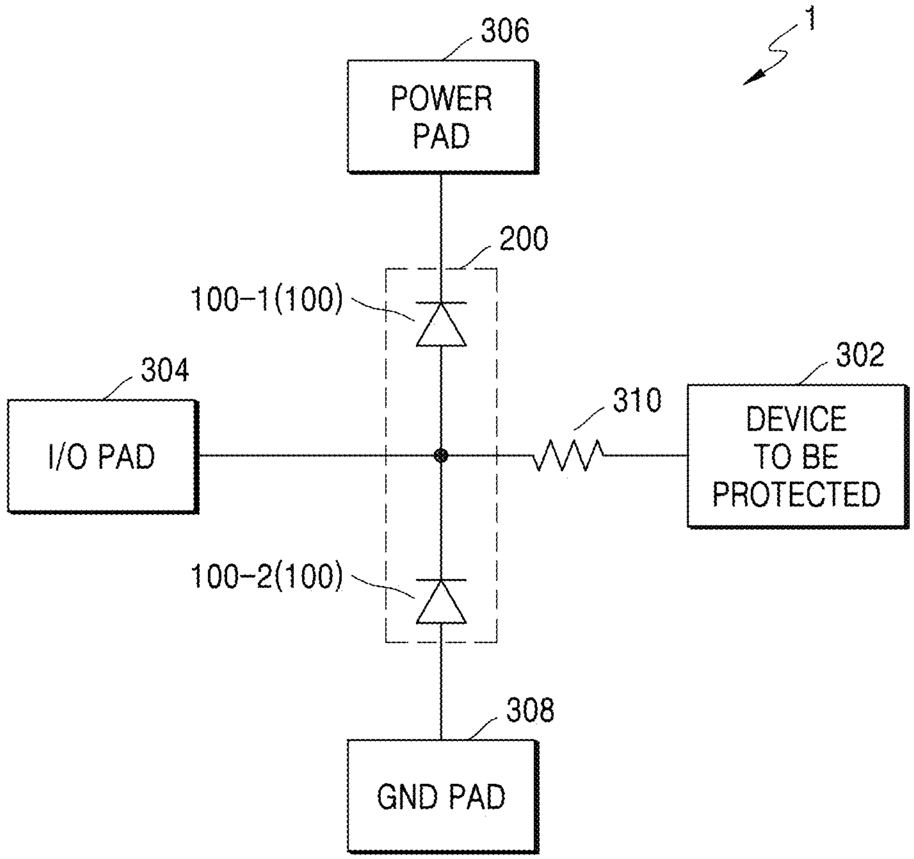
FIG. 1 is an equivalent circuit diagram for an electrostatic discharge (ESD) protection circuit according to some embodiments.

Hereinafter, embodiments are described in detail with reference to the accompanying drawings. The same reference numerals are used for the same components in the drawings, and redundant descriptions thereof are omitted.

FIG. 1 is an equivalent circuit diagram of an ESD protection circuit 1 according to some embodiments.

Referring to FIG. 1, the ESD protection circuit 1 may include an ESD device 100. In some embodiments, the ESD device 100 may be formed on a substrate (or a semiconductor substrate) (refer to 110 in FIG. 3A) together with a device to be protected 302. In some embodiments, a signal voltage may be applied to the device to be protected 302 through an input/output (I/O) pad 304.

According to some embodiments, the ESD protection circuit 1 may include two or more ESD devices 100. For example, the ESD protection circuit 1 may include a dual-diode structure having two ESD devices 100. For example, the two ESD devices 100 may be connected in series.

According to some embodiments, the ESD device 100 may include a first ESD device 100-1 having a P-type diode structure or a second ESD device 100-2 having an N-type diode structure. In some embodiments, the ESD protection circuit 1 may include a first ESD device 100-1 and a second ESD device 100-2 connected in series with each other. In some other embodiments, the ESD protection circuit 1 may include the first ESD device 100-1 and an ESD device connected in series to the first ESD device 100-1 and having an N-type diode structure different from that of the ESD device 100 according to inventive concepts.

In some embodiments, the ESD protection circuit 1 may include a plurality of first ESD devices 100-1 and a plurality of second ESD devices 100-2. In this case, the first ESD devices 100-1 may be connected in parallel to each other, and similarly, the second ESD devices 100-2 may be connected to each other in parallel.

According to some embodiments, an anode terminal of the first ESD device 100-1 may be electrically connected to the I/O pad 304, and a cathode terminal thereof may be electrically connected to the power pad 306. According to some embodiments, an anode terminal of the second ESD device 100-2 may be electrically connected to the ground (GND) pad 308 and a cathode terminal may be electrically connected to the I/O pad 304. According to some embodiments, the I/O pad 304 may be electrically connected to the device to be protected 302 and may be configured to apply a signal voltage to the device to be protected 302, and the I/O pad 304 may be commonly connected to the anode of the first ESD device 100-1 and the cathode of the second ESD device 100-2.

According to some embodiments, the ESD protection circuit 1 may include the ESD devices 100 to be configured to limit and/or prevent electrostatic current from flowing into the device to be protected 302. According to some embodiments, static electricity may be introduced into the ESD protection circuit 1 through the I/O pad 304. In some embodiments, positive (+) static electricity may flow in a forward direction of the first ESD device 100-1 (e.g., forwardly biased) and may escape to a terminal of the power pad 306 to which a power supply voltage Vdd is applied. In this case, the second ESD device 100-2 may be reversely biased, and positive (+) static electricity may be cut off not to flow in a reverse direction by the second ESD device 100-2. In some embodiments, when negative (−) static electricity is applied, the negative (−) static electricity may flow in the forward direction of the second ESD device 100-2 and may escape to a terminal of the ground pad 308 to which a ground voltage $V_{SS}$ is applied. In this case, the first ESD device 100-1 may be reversely biased to limit and/or prevent the negative (−) static electricity from flowing in the reverse direction. As is described below, the ESD device 100 according to some embodiments may implement low ON resistance when a forward voltage is applied thereto, while having a reduced size, and maintain a high breakdown voltage when a reverse voltage is applied thereto.

In some embodiments, a resistance element 310 may be added in front of the device to be protected 302 to more safely protect the device to be protected 302. In some embodiments, the resistance element 310 may be added in front of the device to be protected 302 as a separate component from the ESD protection circuit 1, or may be included as a component of the ESD protection circuit 1.

In some embodiments, the first ESD device 100-1 and the second ESD device 100-2 may be included in a cell 200 as a unit that performs an ESD protection function. In some embodiments, the cell 200 may be configured as a unit further including the I/O pad 304 and the resistance element 310.

In some embodiments, the device to be protected 302 may include all types of electrical and electronic devices that may require protection from ESD. For example, the device to be protected 302 may include various memory devices, such as DRAM and flash, logic devices constituting controllers, and various semiconductor devices, such as interface devices for data communication.

Meanwhile, according to the ESD characteristics of the device to be protected 302, a model in which the device to be protected 302 is damaged may be classified as a human body model (HBM) and a charged device model (CDM). Here, the HBM may refer to a case in which a charged person causes ESD in the device to be protected 302 and damages the device to be protected 302, and the CDM may refer to a case in which the device to be protected 302 itself is charged and the device to be protected 302 causes ESD in a conductor, such as a human body or metal and the device to be protected 302 is damaged. The ESD device 100 according to some embodiments may be used for both HBM and CDM.

Figure 2A:
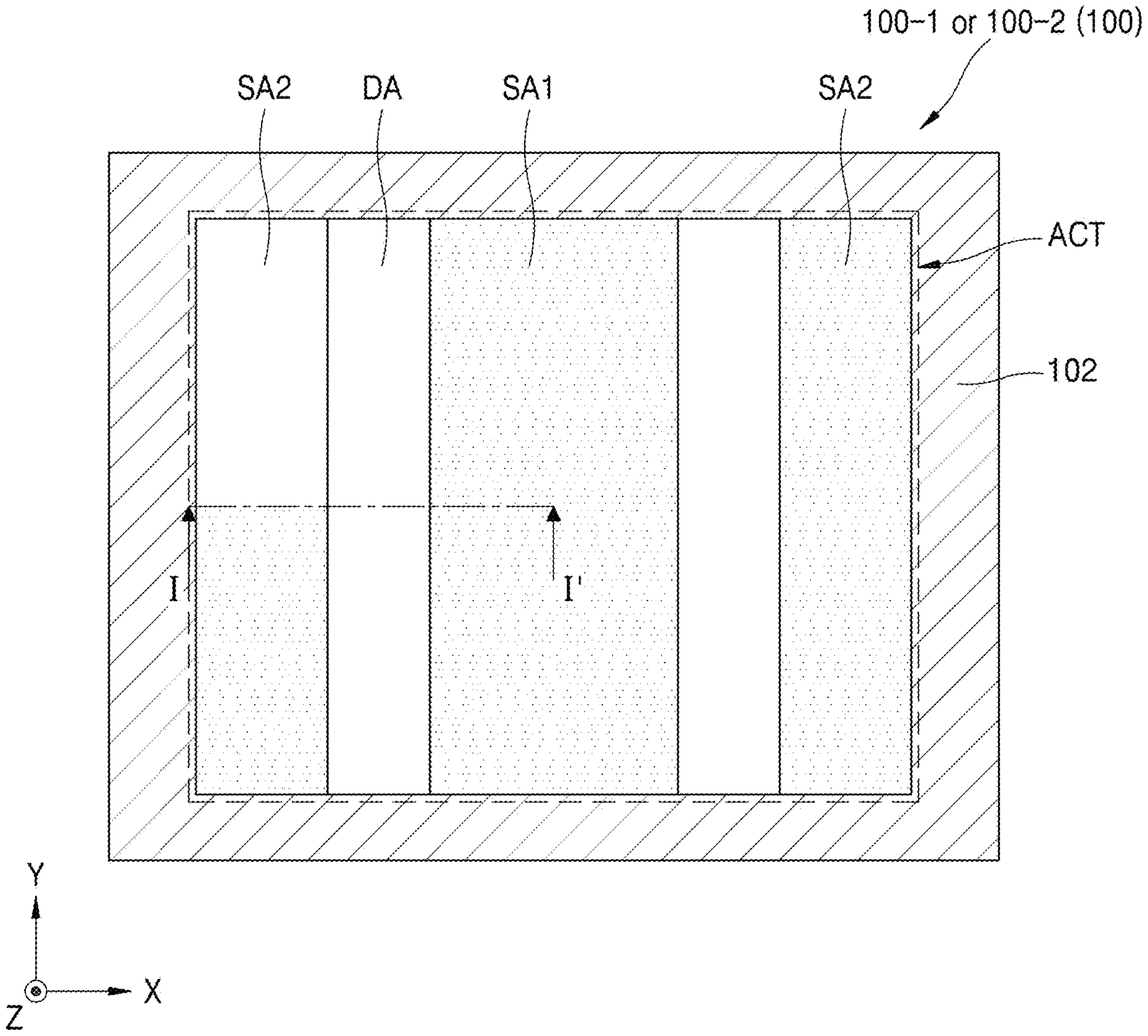
FIGS. 2A and 2B are plan views schematically illustrating shapes of a silicide region and a separation region in an active region of an ESD device according to some embodiments.
Figure 2B:
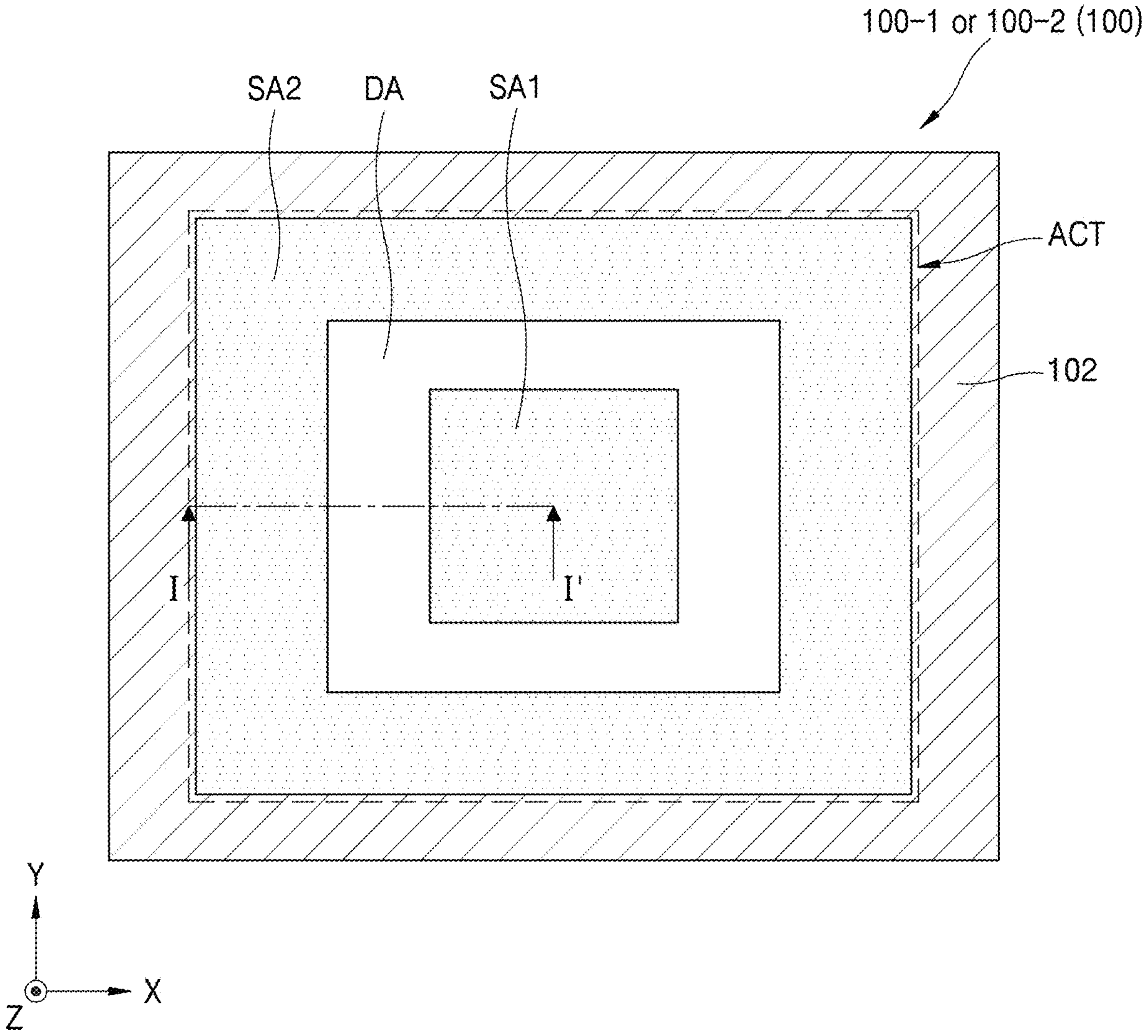

FIGS. 2A and 2B are plan views illustrating an ESD device 100 according to some embodiments.

Figure 3A:
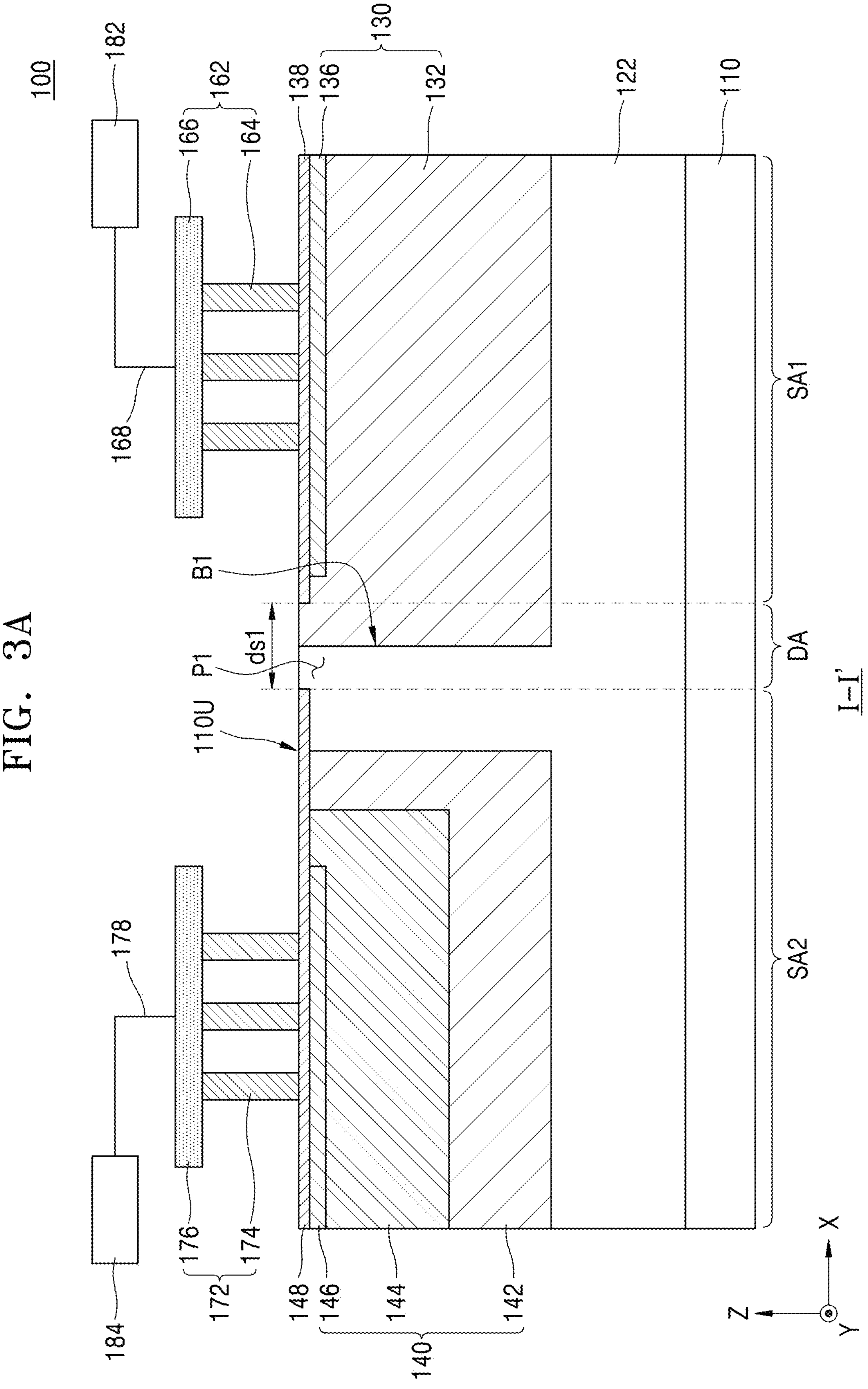
FIG. 3A is a cross-sectional view taken along line I-I' of the plan views of the ESD device of FIGS. 2A and 2B according to some embodiments.

Referring to FIGS. 2A and 2B, the ESD device 100 may include an active region ACT defined by a device isolation layer 102 on the substrate 110 (refer to FIG. 3A). According to some embodiments, the active region ACT may include a first silicide layer region SA1 and a second silicide layer region SA2, which are regions in which silicide is formed on an upper surface 110U of the semiconductor substrate 110, and a separation region DA between the first silicide layer region SA1 and the second silicide layer region SA2. The first silicide layer region SA1 and the second silicide layer region SA2 may refer to regions in which a first silicide layer 138 and a second silicide layer 148 exposed on the upper surface 110U of the semiconductor substrate 110 are respectively located in a plan view, and the separation region DA may refer to a region in which the first silicide layer region SA1 and the second silicide layer region SA2 are not located (refer to FIG. 3A).

Referring to FIG. 2A, the first silicide layer region SA1 may be apart from the second silicide layer region SA2 in a first horizontal direction (an X direction). In some embodiments, the ESD device 100 may have a bar-type structure in which the first silicide layer region SA1 and the second silicide layer region SA2 extend in a second horizontal direction (a Y direction) perpendicular to the first horizontal direction (the X direction). In some embodiments, with the first silicide layer region SA1 at the center, two second silicide layer regions SA2 may be apart from each other in the first horizontal direction (the X direction). In this case, the separation region DA may be formed between the first silicide layer region SA1 and the second silicide layer region SA2.

Referring to FIG. 2B, the second silicide layer region SA2 may be apart from the first silicide layer region SA1 in a horizontal direction (the X direction and/or the Y direction) and surround the first silicide layer region SA1. In some embodiments, the ESD device 100 may have a wrap-around-type structure in which the first silicide layer region SA1 is located at the center and the second silicide layer region SA2 surrounds the first silicide layer region SA1 in a ring shape.

According to some embodiments, in the case of the first ESD device 100-1, a conductivity type of a first region 130 overlapping the first silicide layer region SA1 in a vertical direction (a Z direction) may be P type, and a conductivity type of a second region 140 overlapping the second silicide layer region SA2 in the vertical direction (the Z direction) may be N-type. According to some embodiments, in the case of the second ESD device 100-2, a conductivity type of the first region 130 overlapping the first silicide layer region SA1 in the vertical direction (the Z direction) may be N-type, and a conductivity type of the second region 140 overlapping the second silicide layer region SA2 in the vertical direction (the Z direction) may be P-type.

FIG. 3A is a cross-sectional view taken along line I-I' of the ESD device 100 according to some embodiments having the plan view of FIG. 2A or 2B.

Referring to FIG. 3A, the ESD device 100 may include the first region 130 and the second region 140 in the semiconductor substrate 110, the first silicide layer 138 on the first region 130, and the second silicide layer 148 on the second region 140.

According to some embodiments, the semiconductor substrate 110 may include a group IV semiconductor, such as Si or Ge, a group IV-IV compound semiconductor, such as SiGe or SiC, or a group III-V compound semiconductor, such as GaAs, InAs, or InP. As used herein, the terms "SiGe", "SiC", "GaAs", "InAs", "InGaAs", and "InP" refer to materials including elements included in each term, and are not a chemical formula representing a stoichiometric relationship.

According to some embodiments, a base well 122 may be located in the semiconductor substrate 110, and the first region 130 and the second region 140 having different conductivity types may be located in the base well 122. For example, the first region 130 may have a first conductivity type, and the second region 140 may have a second conductivity type. According to some embodiments, the base well 122, the first region 130 and the second region 140 may each be a semiconductor substrate doped with a P-type dopant or an N-type dopant. For example, the P-type dopant may be selected from boron (B) and gallium (Ga). For example, the N-type dopant may be selected from phosphorus (P), arsenic (As), and antimony (Sb).

According to some embodiments, the semiconductor substrate 110 may be a semiconductor substrate doped with impurities. According to some embodiments, the semiconductor substrate 110 may be a semiconductor substrate having a first conductivity type or a semiconductor substrate having a second conductivity type. According to some embodiments, the semiconductor substrate 110 may have a conductivity type opposite to that of the base well 122. In some embodiments, the semiconductor substrate 110 may have P-type and the base well 122 may have N-type. In some other embodiments, the semiconductor substrate 110 may have N-type and the base well 122 may have P-type.

In some embodiments, the base well 122 may have the same conductivity type as that of the second region 140. In some other embodiments, the base well 122 may have the same conductivity type as that of the first region 130.

The ESD device 100 according to some embodiments may not include an insulating structure between the first region 130 and the second region 140 having different conductivity types. For example, a structure, such as a shallow trench isolation (STI) or a deep trench isolation (DIT), may not be located between active regions of the ESD device 100 having different conductivity types. Accordingly, when a forward voltage is applied to the ESD device 100, a current flow may be formed in a horizontal direction (the X direction and/or the Y direction) near the upper surface 110U of the semiconductor substrate 110, thereby implementing low ON-resistance characteristics.

According to some embodiments, each of the first silicide layer 138 and the second silicide layer 148 may be exposed on the upper surface 110U of the semiconductor substrate 110. For example, an upper surface of the first silicide layer

138 and an upper surface of the second silicide layer 148 may each form part of the upper surface 110U of the semiconductor substrate 110.

According to some embodiments, the first silicide layer 138 may at least partially overlap the first region 130 in the vertical direction (the Z direction) on the first region 130, and the second silicide layer 148 may at least partially overlap the second region 140 in the vertical direction (the Z direction) on the second region 140.

According to some embodiments, the first region 130 may include a first region base well 132 and a first impurity region 136 on the first region base well 132. In this case, the first silicide layer 138 may be disposed on the first impurity region 136. For example, the first silicide layer 138 may entirely cover the first impurity region 136. According to some embodiments, the second region 140 may include a second region base well 142, a second region intermediate well 144 within the second region base well 142, and a second impurity region 146 on the second region intermediate well 144. In this case, the second silicide layer 148 may be disposed on the second impurity region 146. For example, the second silicide layer 148 may entirely cover the second impurity region 146. According to some embodiments, a lower surface of the first silicide layer 138 may be at a level higher than that of a lower surface of the first impurity region 136 in the vertical direction (the Z direction), and a lower surface of the second silicide layer 148 may be located at a level higher than that of a lower surface of the second impurity region 146 in the vertical direction (the Z direction).

According to some embodiments, the first region 130 and the second region 140 may be apart from each other in the horizontal direction (the X direction and/or the Y direction). In this case, in a plan view, the base well 122 may be partially located between the first region 130 and the second region 140. According to some embodiments, a first portion P1, which is a portion of the base well 122 located between the first region 130 and the second region 140 in a plan view, may be exposed on the upper surface 110U of the semiconductor substrate 110. For example, at least a portion of the first portion P1 of the base well 122 may be located between the first silicide layer 138 and the second silicide layer 148. For example, an upper surface of the first portion P1 may be coplanar with the upper surface 110U of the semiconductor substrate 110.

In some embodiments, the base well 122 may have a conductivity type different from that of the first region 130, and a PN junction may be formed between the first region 130 and the base well 122. In this case, an impurity concentration of the base well 122 having the second conductivity type may be lower than that of the second region 140. In some other embodiments, the base well 122 may have the same conductivity type as that of the first region 130, and a PN junction may be formed between the second region 140 and the base well 122. In this case, a concentration of impurities in the base well 122 having the first conductivity type may be lower than that of the first region 130.

The ESD device 100 according to some embodiments includes the first region 130 and the second region 140 apart from each other, so that a size of the ESD device 100 may be reduced and may have a high breakdown voltage without a separate insulating structure between the first region 130 and the second region 140.

According to some embodiments, the first silicide layer 138 and the second silicide layer 148 may not overlap a first boundary B1, that is a portion in which different conductivity types in the semiconductor substrate 110 are in contact with each other in the horizontal direction (the X direction and/or the Y direction) (e.g., a portion in which a PN junction is formed), in the vertical direction (the Z direction). According to some embodiments, the first silicide layer 138 may be apart from the second silicide layer 148 at a first separation distance ds1 in the horizontal direction (the X direction and/or the Y direction) on the first boundary B1.

In some embodiments, the first portion P1 of the base well 122 may be exposed on the upper surface 110U of the semiconductor substrate 110 in the separation region DA between the first silicide layer region SA1 and the second silicide layer region SA2. According to some embodiments, a portion of the first region 130 and/or a portion of the second region 140 may be exposed on the upper surface 110U of the semiconductor substrate 110 in the separation region DA between the first silicide layer region SA1 and the second silicide layer region SA2.

In some embodiments, when the base well 122 has the same conductivity type as that of the second region 140, the first boundary B1 in which the PN junction is formed may be formed at an interface between the first portion P1 of the base well 122 and the first region 130. For example, the separation region DA may include a boundary between the first portion P1 of the base well 122 and the first region 130 in a plan view. For example, the second silicide layer 148 may cover the second region 140 and partially cover the first portion P1 of the base well 122, and the first silicide layer 138 may partially cover the first region 130. For example, the second silicide layer 148 may overlap the second impurity region 146, the second region intermediate well 144, and the second region base well 142 in the vertical direction (the Z direction), and may overlap a portion of the first portion P1 of the base well 122 in the vertical direction (the Z direction). For example, the first silicide layer 138 may overlap the first impurity region 136 in the vertical direction (the Z direction), and may overlap a portion of the first region base well 132 in the vertical direction (the Z direction).

In some other embodiments, when the base well 122 has the same conductivity type as that of the first region 130, unlike FIG. 3A, the first boundary B1 in which the PN junction is formed may be formed at the interface between the first portion P1 of the base well 122 and the second region 140. For example, the separation region DA may include a boundary between the first portion P1 of the base well 122 and the second region 140 in a plan view. For example, the first silicide layer 138 may partially overlap the first portion P1 of the base well 122 in the vertical direction (the Z direction), while covering the first region 130, and the second silicide layer 148 may partially cover the second region 140. For example, the first silicide layer 138 may overlap the first impurity region 136 and the first region base well 132 in the vertical direction (the Z direction), and may overlap a portion of the first portion P1 of the base well 122 in the vertical direction (the Z direction). For example, the second silicide layer 148 may overlap the second impurity region 146 and the second region intermediate well 144 in the vertical direction (the Z direction), and may overlap a portion of the second region base well 142 in the vertical direction (the Z direction).

According to some embodiments, each of the first silicide layer 138 and the second silicide layer 148 may include a metal-semiconductor compound including Ti, W, Ru, Nb, Mo, Hf, Ni, Co, Pt, Yb, Tb, Dy, or Er, or Pd.

According to some embodiments, a lower surface of the first region base well 132 may form a lower surface of the first region 130, and may be at a level lower than that of the lower surface of the first impurity region 136 in the vertical direction (the Z direction). According to some embodiments, the first impurity region 136 may be apart from the boundary of the first region base well 132 inwardly in the horizontal direction (the X direction and/or the Y direction). Accordingly, a breakdown voltage when a reverse bias is applied to the ESD device 100 may be improved.

According to some embodiments, a lower surface of the second region base well 142 may form a lower surface of the second region 140, and the lower surface of the second region base well 142 may be at a level lower than that of the lower surface of the second region intermediate well 144 in the vertical direction (the Z direction) and the lower surface of the second region intermediate well 144 may be at a level lower than that of the lower surface of the second impurity region 146 in the vertical direction (the Z direction). According to some embodiments, the second region intermediate well 144 may be apart from a boundary of the second region base well 142 in the horizontal direction (the X direction and/or the Y direction). According to some embodiments, the second impurity region 146 may be apart from a boundary of the second region intermediate well 144 inwardly in the horizontal direction (the X direction and/or the Y direction). Accordingly, a breakdown voltage when a reverse bias is applied to the ESD device 100 may be improved.

According to some embodiments, the first region 130 and the second region 140 may have a gradually doped structure in each region. According to some embodiments, a concentration of impurities having the first conductivity type in the first region 130 may decrease away from the upper surface 110U of the semiconductor substrate 110 in the vertical direction (the Z direction). According to some embodiments, in the first region 130, an impurity concentration of the first impurity region 136 may be higher than that of the first region base well 132. According to some embodiments, a concentration of impurities having the second conductivity type in the second region 140 may decrease away from the upper surface 110U of the semiconductor substrate 110 in the vertical direction (the Z direction). According to some embodiments, in the second region 140, an impurity concentration of the second impurity region 146 may be higher than that of the second region intermediate well 144, and may be higher than an impurity concentration of the second region base well 142. Accordingly, a vertical current flow may be induced in the first region 130 and in the second region 140 from a vertical point of view. For example, an ESD current may be distributed in a direction away from the upper surface 110U of the semiconductor substrate 110, without being concentrated on the upper surface 110U of the semiconductor substrate 110. Accordingly, it is possible to limit and/or prevent an ESD device 100 from being overheated when static electricity is introduced, and to limit and/or prevent the driving capability of the ESD device from deteriorating.

In addition, from the viewpoint of a flow direction of the ESD current, an abrupt junction between regions having different conductivity types may be limited and/or prevented. In some embodiments, when the base well 122 has a conductivity type different from that of the first region 130, an abrupt junction between the first region 130 and the base well 122 may be limited and/or prevented. In some other embodiments, when the base well 122 has the same conductivity type as that of the first region 130, an abrupt junction between the base well 122 and the second region 140 may be limited and/or prevented. Accordingly, the ESD device 100 may have a high breakdown voltage even without a separate insulating structure between the first region 130 and the second region 140, while having a reduced size.

In some embodiments, concentrations of impurities in the first region 130 and the second region 140 may continuously change. In some other embodiments, concentrations of impurities in the first region 130 and the second region 140 may intermittently change.

In FIG. 3A, depths of the first and second impurity regions 136 and 146 in the vertical direction (the Z direction) are shown to be the same, but are not limited thereto. In some embodiments, a lower surface of the first impurity region 136 may be at a lower level in the vertical direction (the Z direction) than that of the lower surface of the second impurity region 146. In some other embodiments, the lower surface of the second impurity region 146 may be at a lower level in the vertical direction (the Z direction) than that of the lower surface of the first impurity region 136.

In FIG. 3A, the first region base well 132 and the second region base well 142 are shown to have the same depth in the vertical direction (the Z direction), but are not limited thereto. In some embodiments, a lower surface of the first region base well 132 may be at a lower level in the vertical direction (the Z direction) than that of a lower surface of the second region base well 142. In some other embodiments, the lower surface of the second region base well 142 may be at a lower level in the vertical direction (the Z direction) than that of the lower surface of the first region base well 132.

In some embodiments, an area of the first impurity region 136 in the horizontal direction (the X direction and/or the Y direction) may be larger than an area of the second impurity region 146 in the horizontal direction (the X direction and/or the Y direction). Referring to FIG. 2A, the ESD device 100 having a bar-type structure may include the first impurity region 136 having a larger area in the horizontal direction (the X direction and/or the Y direction) than that of the second impurity region 146.

In some other embodiments, an area of the first impurity region 136 in the horizontal direction (the X direction and/or the Y direction) may be smaller than an area of the second impurity region 146 in the horizontal direction (the X direction and/or the Y direction). Referring to FIG. 2B, the ESD device 100 having a wrap-around-type structure may include the first impurity region 136 having a smaller area in the horizontal direction (the X direction and/or the Y direction) than that of the second impurity region 146.

In embodiments, the first region 130 may not include a separate intermediate well between the first impurity region 136 and the first base region well 132, unlike the second region 140 in which the second region intermediate well 144 is located between the second impurity region 146 and the second region base well 142. For example, a slope of a change in a concentration of a first conductivity-type impurity over a change in a distance in a direction away from the upper surface 110U of the semiconductor substrate 110 may be greater than a slope of a change in a concentration of a second conductivity-type impurity over a change in a distance in the direction away from the upper surface 110U. Accordingly, when a plane area of the first impurity region 136 is larger than a plane area of the second impurity region 146, charge imbalance between the first region 130 and the second region 140 having different conductivity types may be limited and/or prevented, and a high breakdown voltage may be maintained when a reverse voltage is applied to the ESD device 100.

According to some embodiments, the ESD device 100 may include a first electrode 168 electrically connected to the first impurity region 136 and a second electrode 178 electrically connected to the second impurity region 146 during driving. According to some embodiments, the first silicide layer 138 may be located between the first impurity region 136 and the first electrode 168, and the second silicide layer 148 may be located between the second impurity region 146 and the second electrode 178. In some embodiments, the first silicide layer 138 may be electrically connected to the first electrode 168 through a first contact structure 162, and the second silicide layer 148 may electrically connected to the second electrode 178 through a second contact structure 172.

In some embodiments, the first contact structure 162 may include a plurality of first contact pillars 164 contacting an upper surface of the first silicide layer 138, and may include a first contact line 166 configured to electrically connect the first contact pillars 164 to the first electrode 168. In some embodiments, the second contact structure 172 may include a plurality of second contact pillars 174 contacting an upper surface of the second silicide layer 148, and may include a second contact line 176 configured to electrically connect the second contact pillars 174 to the second electrode 178. In some embodiments, the ESD device 100 may further include an insulating layer (not shown) covering the upper surface 110U of the semiconductor substrate 110 and surrounding the first contact structure 162 and the second contact structure 172.

According to some embodiments, the first impurity region 136 may be electrically connected to the first pad 182 through the first silicide layer 138 and the first electrode 168, and the second impurity region 146 may be electrically connected to the second pad 184 through the second silicide layer 148 and the second electrode 178. According to some embodiments, the first electrode 168 and the second electrode 178 may be configured to act as an anode and a cathode, or a cathode and an anode, respectively. According to some embodiments, each of the first pad 182 and the second pad 184 may be one of the power pad 306, the I/O pad 304, and the ground pad 308.

In some embodiments, in the case of the first ESD device 100-1, the first conductivity type may be P-type and the second conductivity type may be N-type. In some embodiments, the first pad 182 may be the I/O pad 304, and a signal voltage may be applied to the first pad 182. In this case, the first electrode 168 may act as an anode. In some embodiments, the second pad 184 may be the power pad 306, and a power supply voltage may be applied to the second pad 184. In this case, the second electrode 178 may act as a cathode.

In some embodiments, in the case of the second ESD device 100-2, the first conductivity type may be N-type and the second conductivity type may be P-type In some embodiments, the first pad 182 may be the I/O pad 304, and a signal voltage may be applied to the first pad 182. In this case, the first electrode 168 may act as a cathode. In some embodiments, the second pad 184 may be the ground pad 308, and a ground voltage may be applied to the second pad 184. In this case, the second electrode 178 may act as an anode.

In some embodiments, the first conductivity type of the second ESD device 100-2 may be P type, and the second conductivity type thereof may be N type. In some embodiments, the first pad 182 may be the ground pad 308, and a ground voltage may be applied to the first pad 182. In this case, the first electrode 168 may act as an anode. In some embodiments, the second pad 184 may be the I/O pad 304, and a signal voltage may be applied to the second pad 184.

In this case, the second electrode 178 may act as a cathode. For example, the first ESD device 100-1 and the second ESD device 100-2 may have substantially the same impurity region and well structure, and only the first electrode 168 and the second electrode 178 of the first and second ESD devices 100-1 and 100-2 may be electrically connected to different pads.

Figure 3B:
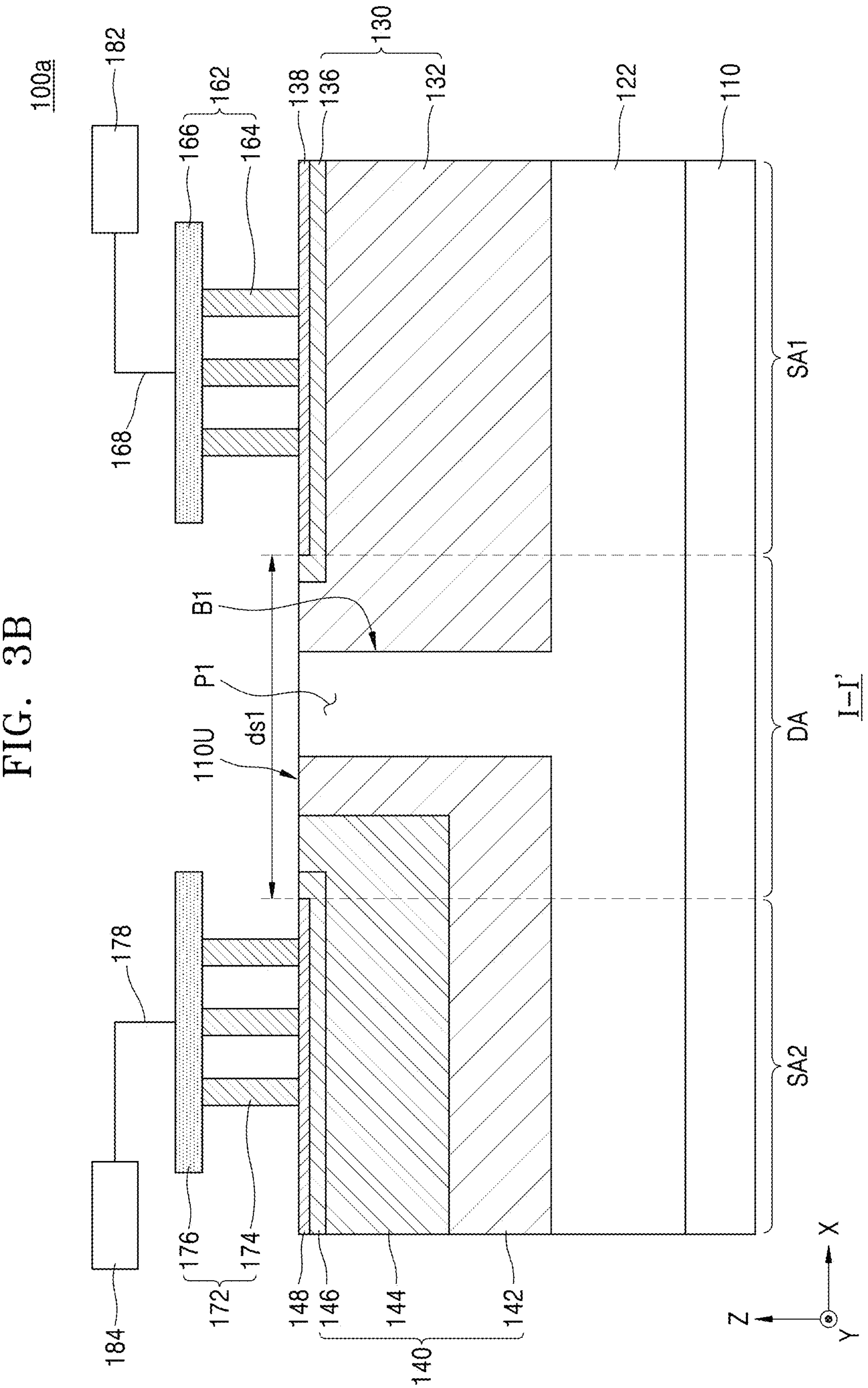
FIG. 3B is a cross-sectional view taken along line I-I' of the plan views of the ESD device of FIGS. 2A and 2B according to some embodiments.

FIG. 3B is a cross-sectional view taken along line I-I' of the ESD device 100*a* according to some embodiments having the plan views of FIGS. 2A and 2B. A difference between FIGS. 3B and 3A is whether the first silicide layer 138 and the second silicide layer 148 only partially cover the first impurity region 136 and the second impurity region 146, respectively.

Referring to FIG. 3B, the first silicide layer 138 may only partially cover the first impurity region 136, and the second silicide layer 148 may only partially cover the second impurity region 146. According to some embodiments, the first silicide layer 138 may be apart from a boundary of the first impurity region 136 inwardly in the horizontal direction (the X direction and/or the Y direction), and the second silicide layer 148 may be apart from a boundary of the second impurity region 146 inwardly in the horizontal direction (the X direction and/or the Y direction). For example, the first silicide layer 138 may be apart from the boundary of the first impurity region 136 in a direction away from the first portion P1 of the base well 122. For example, the second silicide layer 148 may be apart from the boundary of the second impurity region 146 in a direction away from the first portion P1 of the base well 122.

In FIG. 3B, the first silicide layer 138 and the second silicide layer 148 are illustrated as covering the first impurity region 136 and the second impurity region 146 only partially, but are not limited thereto. In some embodiments, the first silicide layer 138 may only partially cover the first impurity region 136, and the second silicide layer 148 may entirely cover the second impurity region 146. In some other embodiments, the first silicide layer 138 may entirely cover the first impurity region 136, and the second silicide layer 148 may only partially cover the second impurity region 146.

Figure 3C:
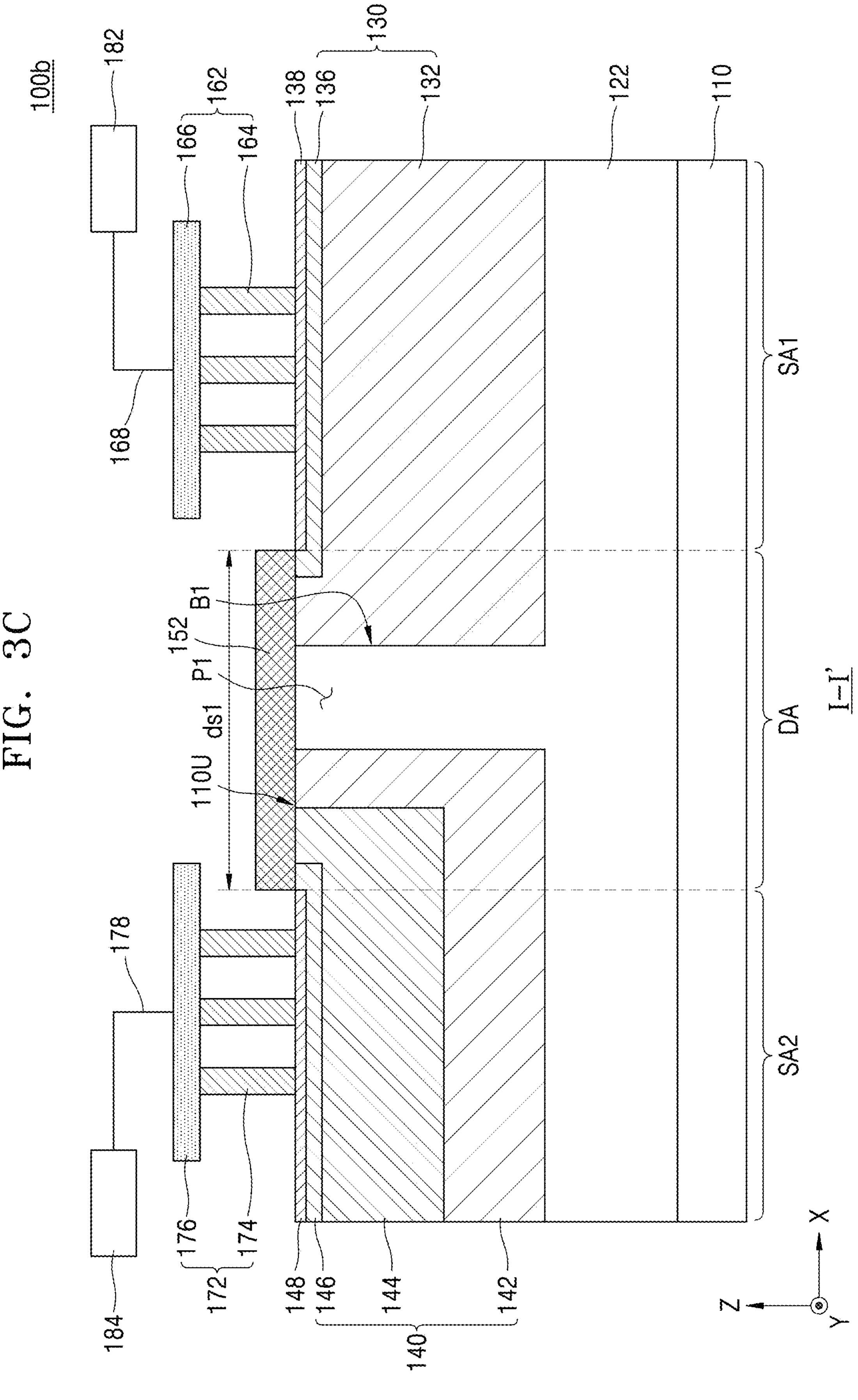
FIG. 3C is a cross-sectional view taken along line I-I' of the plan views of the ESD device of FIGS. 2A and 2B according to some embodiments.

FIG. 3C is a cross-sectional view taken along line I-I' of an ESD device 100*b* according to some embodiments having the plan views of FIGS. 2A and 2B. A difference between FIGS. 3C and 3B is whether an insulating mask 152 disposed on the upper surface 110U of the semiconductor substrate 110 overlapping the first boundary B1 in the vertical direction (the Z direction) is further included.

Referring to FIGS. 3C, 2A, and 2B together, the ESD device 100*b* may further include the insulating mask 152 disposed on the upper surface 110U of the semiconductor substrate 110 overlapping the first boundary B1 in the vertical direction (the Z direction). According to some embodiments, the insulating mask 152 may be disposed on the upper surface 110U of the semiconductor substrate 110 in the separation region DA. In this case, the first portion P1 of the base well 122 may be covered by the insulating mask 152.

According to some embodiments, the insulating mask 152 may act as a mask to limit and/or prevent silicide from being formed on the first boundary B1 in which the PN junction is formed during a silicide process of forming the first and second silicide layers 138 and 148 respectively on the first region 130 and the second region 140. According to some embodiments, the first silicide layer 138 and the second silicide layer 148 may be self-aligned by the insulating mask 152.

According to some embodiments, the insulating mask 152 may include silicon nitride, silicon oxide, SiCN, SiBN, SiON, SiOCN, SiBCN, SiOC, or combinations thereof. As used herein, the terms "SiCN", "SiBN", "SiON", "SiOCN", "SiBCN", and "SiOC" refer to materials including elements included in each term, and are not a chemical formula representing a stoichiometric relationship.

Figure 3D:
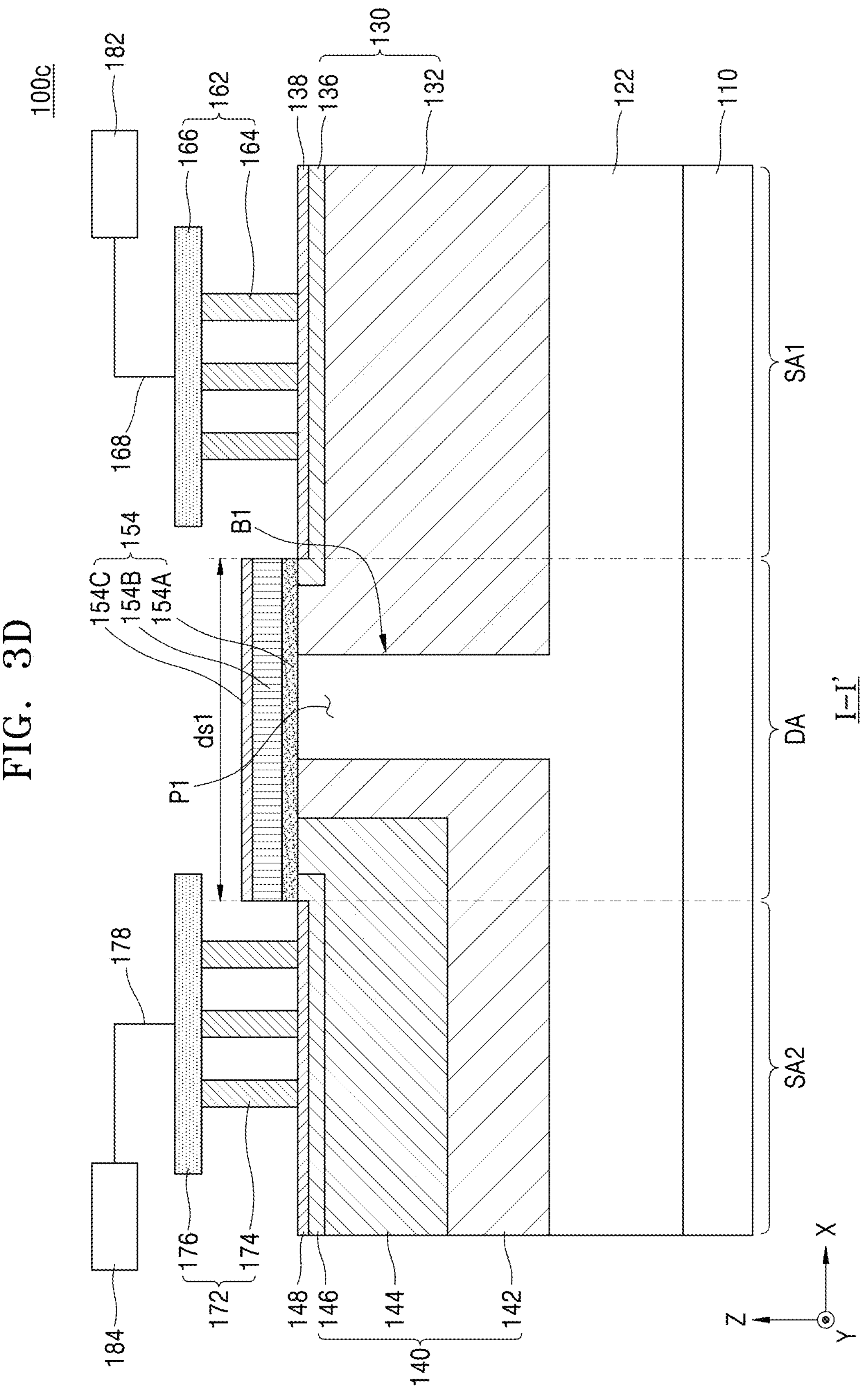
FIG. 3D is a cross-sectional view taken along line I-I' of the plan views of the ESD device of FIGS. 2A and 2B according to some embodiments.

FIG. 3D is a cross-sectional view taken along line I-I' of an ESD device 100*c* according to some embodiments having the plan views of FIGS. 2A and 2B. A difference between FIGS. 3D and 3B is whether a dummy gate structure 154 is disposed on the upper surface 110U of the semiconductor substrate 110 overlapping the first boundary B1 in the vertical direction (the Z direction) is further included.

Referring to FIGS. 3D, 2A, and 2B together, the ESD device 100*c* may further include the dummy gate structure 154 disposed on the upper surface 110U of the semiconductor substrate 110 overlapping the first boundary B1 in the vertical direction (the Z direction). According to some embodiments, the dummy gate structure 154 may be disposed on the upper surface 110U of the semiconductor substrate 110 in the separation region DA. In this case, the first portion P1 of the base well 122 may be covered by the dummy gate structure 154.

In embodiments, the dummy gate structure 154 may include a dummy dielectric layer 154A, a dummy gate layer 154B, and a dummy silicide layer 154C sequentially stacked on the upper surface 110U of the semiconductor substrate 110. According to some embodiments, the dummy dielectric layer 154A may include a metal oxide including silicon oxide, silicon nitride, silicon oxynitride, oxide/nitride/oxide (ONO), or hafnium oxide (HfO). According to some embodiments, the dummy gate layer 154B may include a polysilicon layer. According to some embodiments, the dummy silicide layer 154C may include Ti, W, Ru, Nb, Mo, Hf, Ni, Co, Pt, Yb, Tb, Dy, Er, or Pd.

In embodiments, the dummy gate structure 154 may be formed on the upper surface 110U of the semiconductor substrate 110, after the first region base well 132, the second region base well 142, and the second region intermediate well 144 are formed in the semiconductor substrate 110. Thereafter, a doping process and a silicide process for forming the first and second impurity regions 136 and 146 may be sequentially performed using the dummy gate structure 154 as a mask. According to some embodiments, the first silicide layer 138 may overlap the first impurity region 136 in the vertical direction (the Z direction), and the second silicide layer 148 may overlap the second impurity region 146 in the vertical direction (the Z direction). For example, the first silicide layer 138 and the second silicide layer 148 may be apart from each other by the first separation distance ds1 in the horizontal direction (the X direction and/or the Y direction).

According to some embodiments, the dummy gate structure 154 may act as a mask to limit and/or prevent silicide from being formed on the first boundary B1 in which the PN junction is formed during a silicide process of forming the first and second silicide layers 138 and 148 respectively on the first region 130 and the second region 140. For example, the dummy silicide layer 154C may be formed by consuming a portion of an upper surface of the dummy gate layer 154B in a silicide process. According to some embodiments, the first silicide layer 138 and the second silicide layer 148 may be self-aligned by the insulating mask 152.

Figure 3E:
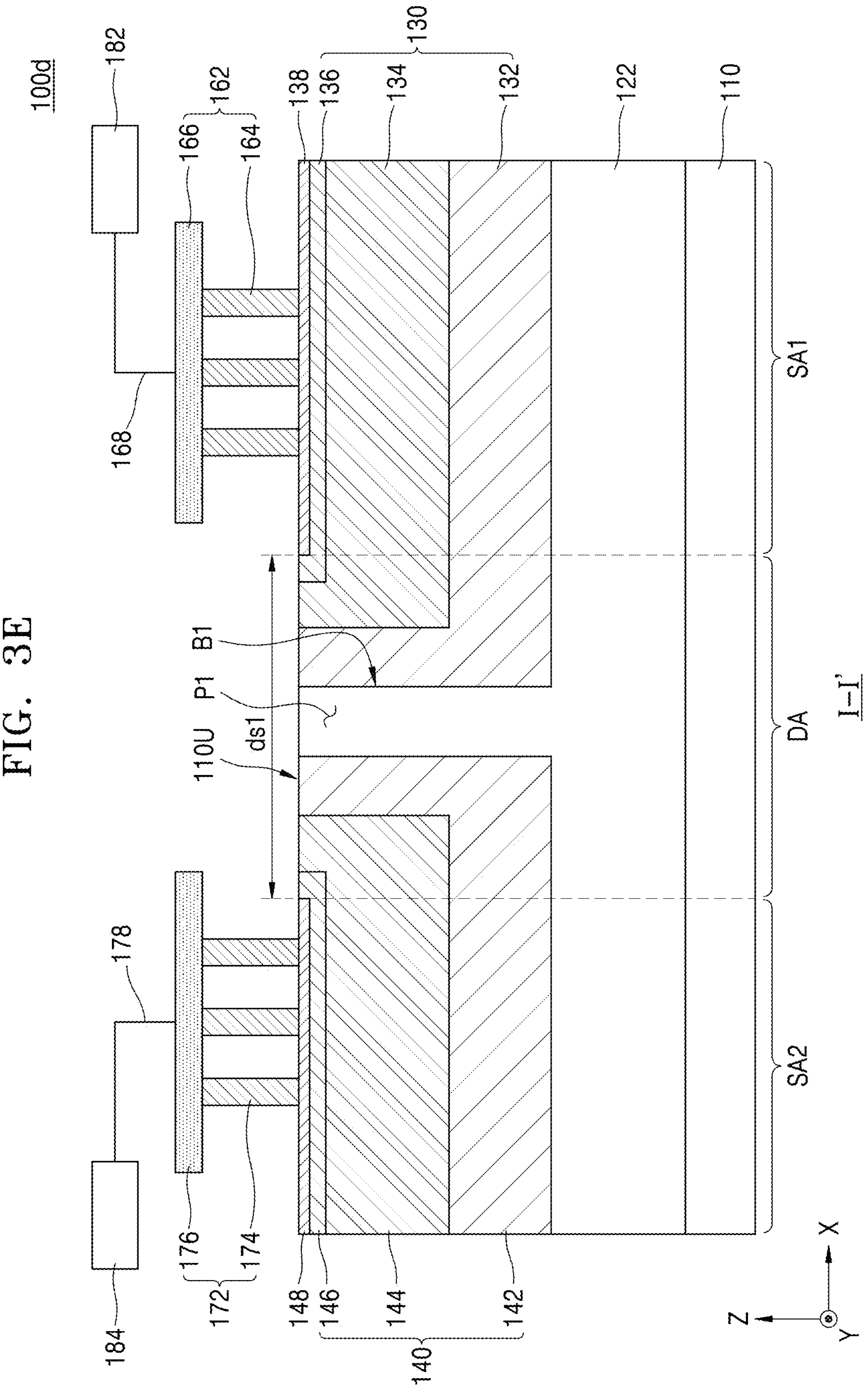
FIG. 3E is a cross-sectional view taken along line I-I' of the plan views of the ESD device of FIGS. 2A and 2B according to some embodiments.

FIG. 3E is a cross-sectional view taken along line I-I' of an ESD device 100*d* according to some embodiments having the plan views of FIGS. 2A and 2B. A difference between FIGS. 3E and 3B is whether the first region 130 further includes the first region intermediate well 134 between the first impurity region 136 and the first region base well 132.

Referring to FIG. 3E, the ESD device 100*d* may include the first region intermediate well 134 disposed within the first region base well 132. In this case, the first impurity region 136 may be disposed on the first region intermediate well 134. According to some embodiments, an impurity concentration of the first region intermediate well 134 may be higher than that of the first region base well 132 and lower than that of the first impurity region 136.

In the above, although the first region intermediate well 134 and the second region intermediate well 144 are shown and described as including one well, the first region intermediate well 134 and the second region intermediate well 144 may each include two or more multiple wells.

Figure 4A:
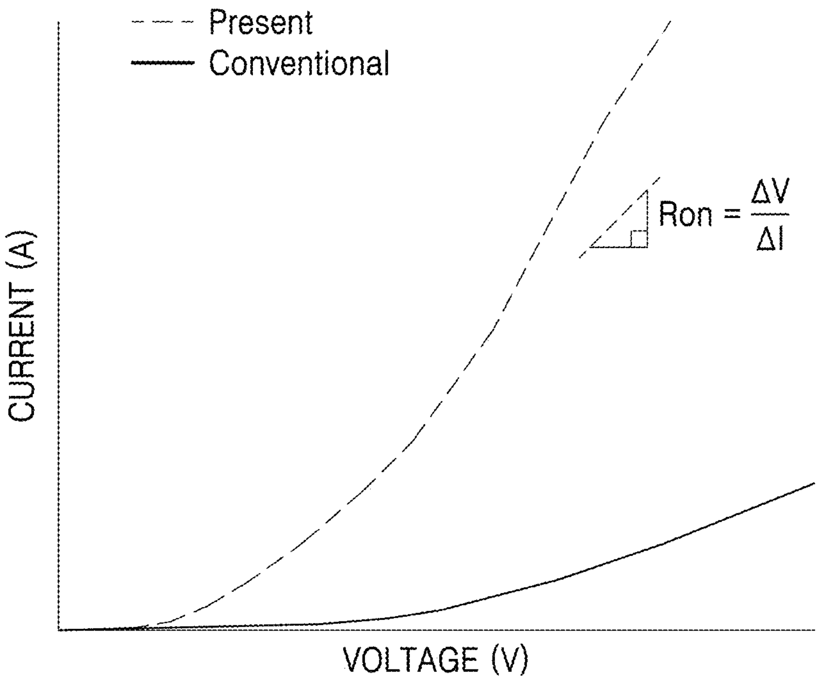
FIG. 4A is a graph illustrating on-resistance (Ron) characteristics of a comparative ESD device having a P-type diode structure and an ESD device having a P-type diode structure according to some embodiments.

FIG. 4A is a graph illustrating ON-resistance (Ron) characteristics of a comparative ESD device having a P-type diode structure and the ESD device 100 having a P-type diode structure according to some embodiments. The X-axis represents a voltage applied between the first impurity region 136 and the second impurity region 146, and the Y-axis represents a current according to application of the voltage.

Figure 4B:
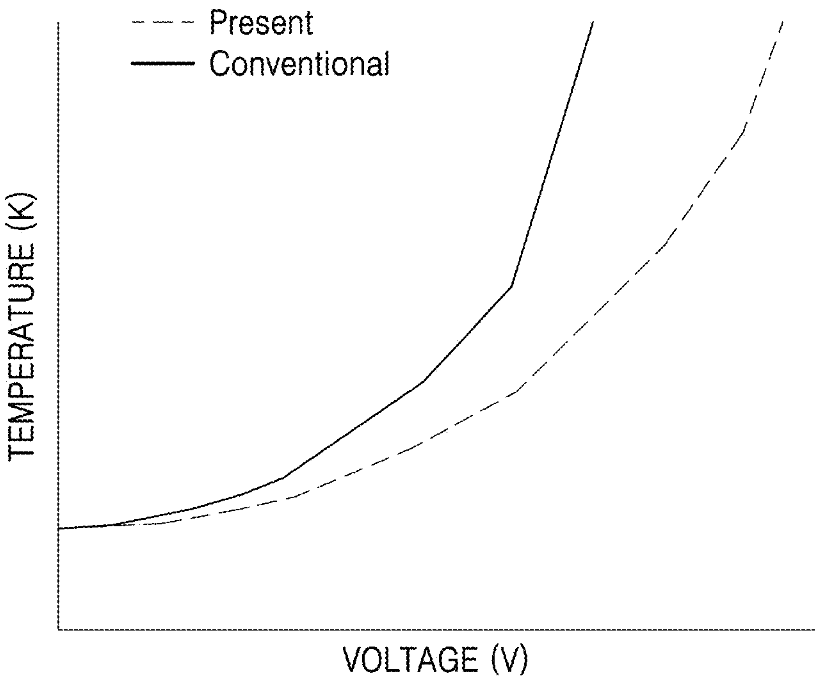
FIG. 4B is a graph illustrating heating characteristics of a comparative ESD device having a P-type diode structure and an ESD device having a P-type diode structure according to some embodiments.

FIG. 4B is a graph illustrating heating characteristics of a comparative ESD device having a P-type diode structure and the ESD device 100 having a P-type diode structure according to some embodiments. The X-axis represents a current flowing into the ESD device, and the Y-axis represents a temperature change of the device according to the current.

In FIGS. 4A and 4B, the solid lines denote comparative ESD devices having a P-type diode structure, and dashed lines denote the first ESD device 100-1 according to example embodiments. The graphs of FIGS. 4A and 4B show data when the comparative ESD device having a P-type diode structure and the first ESD device 100-1 according to example embodiments have the same size.

For example, the comparative P-type ESD device may not include a structure in which the first region 130 and the second region 140 are apart from each other in the horizontal direction (the X direction and/or the Y direction), a structure in which the impurity concentration gradually changes in the first and second regions 130 and 140, or a structure in which the first and second impurity regions 136 and 146 are apart inwardly from the boundary of the first region base well 132 and the boundary of the second region base well 142, such as in the first ESD device 100-1 of inventive concepts according to FIG. 3A. For example, the comparative P-type ESD device may include an insulating structure, such as a shallow trench isolation (STI), between the first region 130 and the second region 140, unlike the first ESD device 100-1 of inventive concepts according to FIG. 3A.

Referring to FIG. 4A, the first ESD device 100-1 according to some embodiments may have a greater amount of current change over the amount of voltage change represented by a slope of the graph than a comparative P-type ESD device. The ON-resistance may be calculated as the amount of voltage change over the amount of current change, and the first ESD device 100-1 according to some embodiments may have a smaller ON-resistance than the comparative P-type ESD device.

Referring to FIG. 4B, the amount of temperature change over the amount of current change represented by the slope of the graph may be smaller in the first ESD device 100-1 according to some embodiments than in the comparative P-type ESD device. For example, the first ESD device 100-1 according to some embodiments may have improved lifespan characteristics improved as heating is lowered when static electricity is introduced, compared to the comparative P-type ESD device.

Figure 5:
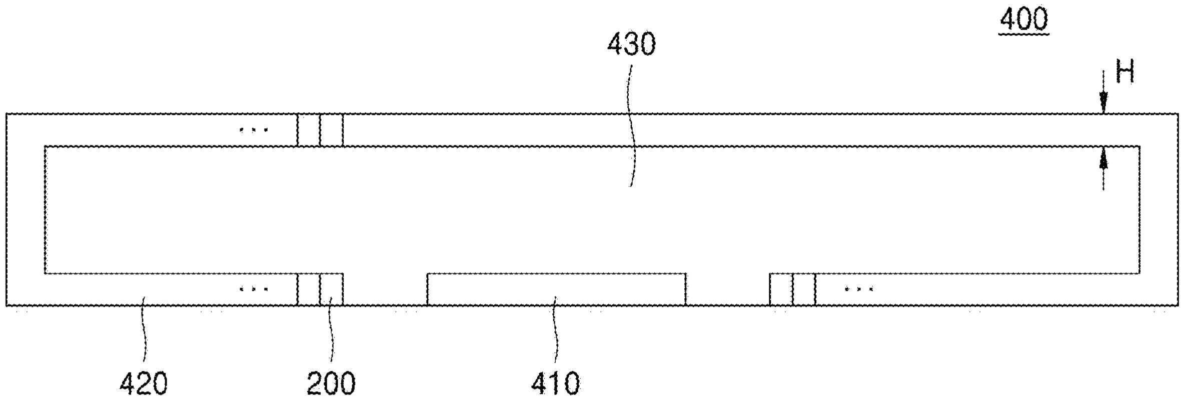
FIG. 5 is a plan view illustrating a display drive chip including an ESD device according to some embodiments.

FIG. 5 is a plan view illustrating a display drive chip 400 including the ESD device 100 according to some embodiments.

Referring to FIG. 5, the display drive chip 400 may include an input region 410, an output region 420, and a circuit region 430. According to some embodiments, the circuit region 430 may include a display driver integrated circuit (DDI). For example, the circuit region 430 may be configured to generate a driving signal for a display panel. According to some embodiments, the input region 410 may be configured to receive a control signal from the outside of the display drive chip 400 and supply the received control signal to the DDI. According to some embodiments, the input region 410 may include a plurality of I/O pads 304, a plurality of power pads 306, a plurality of ground pads 308, and a plurality of ESD devices 100. According to some embodiments, the output region 420 may be configured to supply a signal from the DDI to an external device (e.g., a display panel). According to some embodiments, the output region 420 may include I/O pads 304, power pads 306, ground pads 308, and ESD devices 100.

According to some embodiments, the circuit region 430 may be located at the center of the display drive chip 400. According to some embodiments, the input region 410 and the output region 420 may be arranged at the edge of the display drive chip 400. For example, the display drive chip 400 may have a rectangular shape having two longer sides and two shorter sides. For example, the input region 410 may be partially located in one of the two longer sides, and the output region 420 may be located in an edge region of the display drive chip 400 excluding the input region 410. For example, the output region 420 may be apart from the input region 410 by a certain interval. For example, although the output region 420 is illustrated as extending as one region in FIG. 5, the output region 420 may be divided into a plurality of regions and located at the edge region of the display drive chip 400, and in this case, the output regions 420 may be apart from each other. According to some embodiments, the output region 420 may surround the circuit region 430 at the edge of the display drive chip 400.

According to some embodiments, the output region 420 may include a plurality of cells 200. According to some embodiments, the cells 200 may be arranged along the edge of the display drive chip 400 and may surround the DDI. For example, in the equivalent circuit diagram of FIG. 1, the device to be protected 302 may be a DDI. The cell 200 according to some embodiments may include the ESD devices 100 according to the embodiments described above, and may realize improved ESD protection performance, while having a reduced size, compared to the cell 200 according to the related art. For example, a stable clamping voltage and breakdown voltage may be implemented, while the size of the ESD device is reduced.

Accordingly, a width H of the output region 420 may be reduced, and an area of the display drive chip 400 may be reduced.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While embodiments of inventive concepts have been particularly shown and described with reference to some embodiments thereof, it will be understood that various changes in form and details may be made therein without departing from the spirit and scope of the following claims.

What is claimed is:

1. An electrostatic discharge (ESD) device comprising:

a semiconductor substrate, the semiconductor substrate including a base well, a first region in the base well, and a second region in the base well, the first region including a first region base well having a first conductivity type and a first impurity region having the first conductivity type on the first region base well, the second region being apart from the first region in a horizontal direction in the base well, the second region including a second region base well having a second conductivity type, a second region intermediate well having the second conductivity type in the second region base well, and a second impurity region having the second conductivity type on the second region intermediate well, the second conductivity type being opposite the first conductivity type;

a first silicide layer on the first impurity region, the first silicide layer at least partially overlapping the first impurity region in a vertical direction; and a second silicide layer on the second impurity region and spaced apart from the first silicide layer in the horizontal direction, the second silicide layer at least partially overlapping the second impurity region in the vertical direction, wherein a first portion of the base well is located between the first region and the second region, and at least a portion of the first portion of the base well is located in a first separation region of the semiconductor substrate between the first silicide layer and the second silicide layer, wherein an impurity concentration of the second region intermediate well is higher than an impurity concentration of the second region base well.

2. The ESD device of claim 1, wherein the base well has the second conductivity type, and in a plan view, the first separation region includes a boundary between the first portion of the base well and the first region base well.

3. The ESD device of claim 1, wherein the base well has the first conductivity type, and in a plan view, the first separation region includes a boundary between the first portion of the base well and the second region base well.

4. The ESD device of claim 1, wherein the base well has the second conductivity type, the first silicide layer covers the first impurity region and partially overlaps the first region base well in the vertical direction, and the second silicide layer covers the second impurity region, the second region intermediate well, and the second region base well, and partially overlaps the base well in the vertical direction.

5. The ESD device of claim 1, wherein
the first silicide layer partially covers the first impurity region and is apart from a boundary of the first impurity region, and
the second silicide layer partially covers the second impurity region and is apart from a boundary of the second impurity region.

6. The ESD device of claim 1, further comprising:
a dummy mask on an upper surface of the semiconductor substrate in the first separation region.

7. The ESD device of claim 1, further comprising:
a first region intermediate well having the first conductivity type, within the first region base well,
wherein the first impurity region is disposed on the first region intermediate well.

8. The ESD device of claim 1, wherein
the first impurity region is apart from a boundary of the first region base well,
the second region intermediate well is apart from a boundary of the second region base well, and
the second impurity region is apart from a boundary of the second region intermediate well.

9. The ESD device of claim 1, wherein
an impurity concentration of the first impurity region is higher than an impurity concentration of the first region base well, and
an impurity concentration of the second impurity region is higher than the impurity concentration of the second region intermediate well.

10. The ESD device of claim 1, wherein a conductivity type of the semiconductor substrate is different from a conductivity type of the base well.

11. A display drive chip comprising:
a circuit region;
an input region; and
an output region including a plurality of cells, wherein
the plurality of cells include the ESD device of claim 1,
the semiconductor substrate is a P-type semiconductor substrate, the base well is N-type in the P-type semiconductor substrate, and
the first portion of the base well is exposed to an upper surface of the P-type semiconductor substrate between the first silicide layer and the second silicide layer.

12. The display drive chip of claim 11, wherein
the ESD device has a bar-type structure in which the first silicide layer and the second silicide layer each extend in a first horizontal direction and are parallel to each other in a second horizontal direction, and
the second horizontal direction is perpendicular to the first horizontal direction.

13. The display drive chip of claim 11, wherein
the ESD device has a wraparound-type structure in which the first silicide layer is at a center and the second silicide layer surrounds the first silicide layer.

14. The display drive chip of claim 11, wherein
the circuit region includes a display driver integrated circuit (DDI), and
the plurality of cells surround the DDI at an edge of the display drive chip.

15. An electrostatic discharge (ESD) device comprising:
a semiconductor substrate,
the semiconductor substrate including a base well, a first region in the base well, and a second region in the base well,
the base well having a first conductivity type,
the first region including a first region base well having the first conductivity type and a first impurity region on the first region base well, the first impurity region having the first conductivity type,
the second region being apart from the first region in a horizontal direction,
the second region including a second region base well having a second conductivity type, a second region intermediate well having the second conductivity type in the second region base well, and a second impurity region having the second conductivity type on the second region intermediate well, the second conductivity type being opposite the first conductivity type;
a first silicide layer on the first impurity region, the first silicide layer at least partially overlapping the first impurity region in a vertical direction and connecting to a first electrode;
a second silicide layer on the second impurity region, the second silicide layer being apart from the first silicide layer in the horizontal direction, the second silicide layer at least partially overlapping the second impurity region in the vertical direction and connecting to a second electrode; and
a dummy gate structure on an upper surface of the semiconductor substrate, the dummy gate structure on a first separation region of the semiconductor substrate, the first separation region being between the first silicide layer and the second silicide layer.

16. The ESD device of claim 15, wherein
a first portion of the base well is located between the first region and the second region, and
an impurity concentration of the base well is lower than an impurity concentration of the first region base well.

17. The ESD device of claim 15, wherein
the first silicide layer overlaps the first impurity region in the vertical direction, and
the second silicide layer overlaps the second impurity region in the vertical direction.

18. The ESD device of claim 15, wherein the dummy gate structure includes:
a dummy dielectric layer on an upper surface of the semiconductor substrate;
a dummy gate layer on the dummy dielectric layer; and
a dummy silicide layer on the dummy gate layer.

19. The ESD device of claim 15, wherein
the first conductivity type is P-type,
the second conductivity type is N-type,
the first electrode acts as an anode and is electrically connected to an input/output (I/O) pad, and
the second electrode acts as a cathode and is electrically connected to a power pad.

20. The ESD device of claim 15, wherein
the first conductivity type is N-type,
the second conductivity type is P-type,
the first electrode acts as a cathode and is electrically connected to an I/O pad, and
the second electrode acts as an anode and is electrically connected to a ground pad.

* * * * *